(12) United States Patent
Yoshida et al.

(10) Patent No.: US 9,085,714 B2
(45) Date of Patent: Jul. 21, 2015

(54) POLISHING AGENT AND POLISHING METHOD

(71) Applicant: ASAHI GLASS COMPANY, LIMITED, Chiyoda-ku (JP)

(72) Inventors: Iori Yoshida, Tokyo (JP); Satoshi Takemiya, Tokyo (JP); Hiroyuki Tomonaga, Tokyo (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 0 days.

(21) Appl. No.: 14/095,384

(22) Filed: Dec. 3, 2013

(65) Prior Publication Data

US 2014/0094032 A1    Apr. 3, 2014

Related U.S. Application Data

(63) Continuation of application No. PCT/JP2012/063636, filed on May 28, 2012.

(30) Foreign Application Priority Data

Jun. 3, 2011    (JP) ................................. 2011-125170

(51) Int. Cl.
| | | |
|---|---|---|
| *C09K 13/00* | (2006.01) | |
| *C09G 1/02* | (2006.01) | |
| *H01L 21/02* | (2006.01) | |
| *H01L 21/04* | (2006.01) | |
| *H01L 21/306* | (2006.01) | |

(52) U.S. Cl.
CPC ............ *C09G 1/02* (2013.01); *H01L 21/02024* (2013.01); *H01L 21/0475* (2013.01); *H01L 21/30625* (2013.01)

(58) Field of Classification Search
USPC ........................ 216/37, 67, 83; 438/689–693; 252/79.1–79.4
See application file for complete search history.

(56) References Cited

U.S. PATENT DOCUMENTS

| | | | |
|---|---|---|---|
| 2002/0043027 A1* | 4/2002 | Sakai et al. ..................... | 51/308 |
| 2002/0110661 A1 | 8/2002 | Kuramochi et al. | |
| 2005/0059247 A1 | 3/2005 | Ikenaka | |
| 2007/0021040 A1* | 1/2007 | Kawata et al. ................. | 451/41 |

(Continued)

FOREIGN PATENT DOCUMENTS

| | | |
|---|---|---|
| CN | 1340583 | 3/2002 |
| DE | 601 28 301 | 1/2008 |

(Continued)

OTHER PUBLICATIONS

U.S. Appl. No. 14/197,844, filed Mar. 5, 2014, Yoshida, et al.

(Continued)

*Primary Examiner* — Duy Deo
*Assistant Examiner* — Maki Angadi
(74) *Attorney, Agent, or Firm* — Oblon, McClelland, Maier & Neustadt, L.L.P.

(57) ABSTRACT

A polishing agent for polishing a non-oxide single-crystal substrate such as a silicon carbide single-crystal substrate with a high polishing rate to obtain a smooth surface is provided. This polishing agent comprises an oxidant having redox potential of 0.5 V or more and containing a transition metal, silicon oxide particles, cerium oxide particles and a dispersion medium, in which a mass ratio of the silicon oxide particles to the cerium oxide particles is from 0.2 to 20.

16 Claims, 1 Drawing Sheet

(56) References Cited

U.S. PATENT DOCUMENTS

2008/0153292 A1* 6/2008 White et al. .............. 438/692
2008/0173843 A1 7/2008 Hotta et al.

FOREIGN PATENT DOCUMENTS

| | | |
|---|---|---|
| EP | 1 182 242 | 2/2002 |
| EP | 1 950 263 | 7/2008 |
| JP | 2002-075927 | 3/2002 |
| JP | 2002-166355 | 6/2002 |
| JP | 2005-117027 | 4/2005 |
| JP | 2008-068390 | 3/2008 |
| JP | 2008-179655 | 8/2008 |
| KR | 2002-0016596 | 3/2002 |
| KR | 2002-0042521 | 6/2002 |
| TW | 539735 | 8/1990 |
| TW | 572811 | 11/1990 |
| WO | 2007/063873 | 6/2007 |

OTHER PUBLICATIONS

U.S. Appl. No. 14/064,397, filed Oct. 28, 2013, Yoshida, et al.
International Search Report issued Aug. 28, 2012 in PCT/JP2012/063636 filed May 28, 2012.
International Preliminary Report on Patentability issued Dec. 19, 2013 in PCT/JP2012/063636 filed May 28, 2012 submitting English translation only.
Written Opinion issued Aug. 28, 2012 in PCT/JP2012/063636 filed May 28, 2012 submitting English translation only.

* cited by examiner

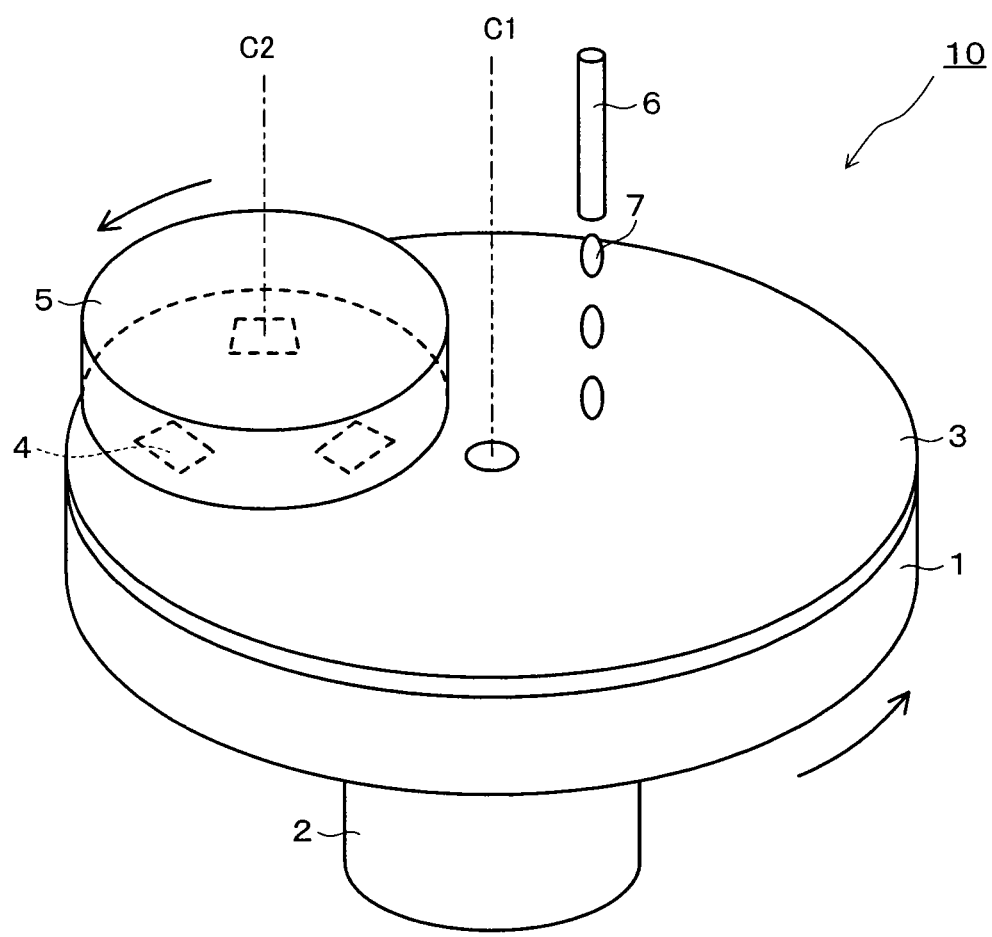

POLISHING AGENT AND POLISHING METHOD

CROSS-REFERENCE TO RELATED APPLICATIONS

This application is a continuation of prior International Application No. PCT/JP2012/063636, filed on May 28, 2012 which is based upon and claims the benefit of priority from Japanese Patent Application No. 2011-125170 filed on Jun. 3, 2011; the entire contents of all of which are incorporated herein by reference.

FIELD

The present invention relates to a polishing agent and a polishing method for chemically and mechanically polishing a non-oxide single-crystal substrate. In more detail, the present invention relates to a polishing agent suitable for polishing a silicon carbide single-crystal substrate and the like and a polishing method using the polishing agent.

BACKGROUND

Because a silicon carbide (SiC) semiconductor is higher in dielectric breakdown field, saturated drift velocity of electrons, and thermal conductivity than a silicon semiconductor, researches and developments have been made on the use of the silicon carbide semiconductor for realizing a power device capable of operating at higher temperature and at a higher speed than conventional silicon devices. The development of highly efficient switching elements used in power sources for driving motors of electric bicycles, electric vehicles, hybrid cars and the like has been drawing attention. In order to realize such a power device, a silicon carbide single-crystal substrate having a smooth surface is required as a substrate where to epitaxially grow a high-quality silicon carbide semiconductor layer.

Further, as a light source for high-density information recording, a blue laser diode has been drawing attention, and a need for a white diode as a light source to replace fluorescent lamps and bulbs is also increasing. A gallium nitride (GaN) semiconductor is used to fabricate such a light-emitting element, and as a substrate where to form a high-quality gallium nitride semiconductor layer, a silicon carbide single-crystal substrate is used.

For the silicon carbide single-crystal substrate for such applications, high machining accuracy is required in terms of flatness of the substrate, smoothness of the surface of the substrate and the like. However, because a silicon carbide single crystal has very high hardness and excellent corrosion resistance, its workability when the substrate is fabricated is poor, which makes it difficult to obtain the silicon carbide single-crystal substrate having high smoothness.

Generally, a smooth surface of a semiconductor single-crystal substrate is formed by polishing. When a silicon carbide single crystal is polished, abrasive particles of diamond or the like harder than silicon carbide are used to mechanically polish the surface to form the flat surface. Minute scratches according to a particle size of the diamond abrasive particles are introduced in the surface of the silicon carbide single-crystal substrate polished by the diamond abrasive particles. Further, since a work-affected layer having a mechanical strain is generated in the surface, the surface of the silicon carbide single-crystal substrate does not have sufficient smoothness as it is.

In the manufacture of the semiconductor single-crystal substrate, as a method for smoothing the surface of the semiconductor substrate having undergone the mechanical polishing, chemical mechanical polishing (sometimes herein after referred to as CMP) technology is used. The CMP is a method to use a chemical reaction such as oxidation to change a workpiece to an oxide or the like and use abrasive particles lower in hardness than the workpiece to remove the generated oxide, thereby polishing its surface. This method has an advantage of being capable of forming a very smooth surface without causing a strain in the surface of the workpiece.

As a polishing agent for more smoothly polishing the surface of the silicon carbide single-crystal substrate by the CMP, a polishing composition with pH4 to 9 containing colloidal silica has been conventionally known (refer to JP-A 2005-117027 (KOKAI), for example). There has also been proposed a polishing composition containing silica abrasive particles, an oxidant such as hydrogen peroxide (oxygen imparting agent), and vanadate (refer to JP-A 2008-179655 (KOKAI), for example).

However, in the use of the polishing composition described in JP-A 2005-117027 (KOKAI), a polishing rate for the silicon carbide single-crystal substrate is low and thus it takes a very long time for the polishing. Further, the use of the polishing composition described in JP-A 2008-179655 (KOKAI) has a problem that a polishing rate is not high enough and thus it takes a long time for the polishing.

Furthermore, a method of polishing the surface of the silicon carbide single-crystal substrate and the like smooth by using cerium oxide (ceria) abrasive particles under existence of an oxidizing polishing liquid is also proposed, but dispersibility of the cerium oxide particles in the polishing liquid is low, and therefore, there are problems in which not only it is difficult to stably obtain a high polishing rate but also efficiency of polishing work is easy to decrease.

SUMMARY OF THE INVENTION

The present invention has been made to solve the problems as stated above, and its object is to provide a polishing agent to form a smooth surface by polishing a non-oxide single-crystal substrate whose hardness is high and chemical stability is high such as a silicon carbide single-crystal substrate with a high polishing rate.

A polishing agent of the present invention is a polishing agent for chemically and mechanically polishing a non-oxide single-crystal substrate, the polishing agent comprising an oxidant having redox potential of 0.5 V or more and containing a transition metal, silicon oxide particles and cerium oxide particles, and a dispersion medium, in which a mass ratio of the silicon oxide particles to the cerium oxide particles is from 0.2 to 20.

In the polishing agent of the present invention, the oxidant is preferably permanganate ion. A content of permanganate ion is preferably 0.015 mass % or more and 5 mass % or less. Besides, the content of the cerium oxide particles is preferably 0.05 mass % or more and 15 mass % or less.

Both of an average secondary particle diameter of the cerium oxide particles and an average secondary particle diameter of the silicon oxide particles are preferably 0.5 μm or less. Besides, the silicon oxide particle is preferably colloidal silica.

Further, in the polishing agent of the present invention, pH is preferably 11 or less, and more preferably 5 or less. In addition, the non-oxide single-crystal substrate is preferably a silicon carbide (SiC) single-crystal substrate or a gallium nitride (GaN) single-crystal substrate.

A polishing method of the present invention is a method comprising supplying the polishing agent of the present invention to a polishing pad, bringing a surface to be polished of a non-oxide single-crystal substrate being a polishing object into contact with the polishing pad, and polishing by a relative movement between the surface to be polished and the polishing pad.

According to the polishing agent and the polishing method using the same of the present invention, it is possible to polish, at a high polishing rate, a surface to be polished of the non-oxide single-crystal substrate high in hardness and high in chemical stability, such as a silicon carbide single-crystal substrate or a gallium nitride single-crystal substrate, and to obtain the flat and smooth polished surface. Besides, in the polishing agent of the present invention, dispersibility of cerium oxide particles being abrasive particles is high, and the cerium oxide particles are difficult to sediment and separate, and therefore, it is possible to stably obtain a high polishing rate and high polishing workability. Note that the "surface to be polished" in the present invention means a surface that is polished, of an object to be polished, and for example, its front surface.

BRIEF DESCRIPTION OF THE DRAWING

FIG. 1 is a view showing an example of a polishing apparatus capable of being used for an embodiment of the polishing method of the present invention.

DETAILED DESCRIPTION

Hereinafter, embodiments of the present invention will be described.

[Polishing Agent]

A polishing agent of the present invention is an agent for chemically and mechanically polishing a non-oxide single-crystal substrate. The polishing agent comprises an oxidant containing a transition metal and having redox potential of 0.5 V or more, silicon oxide particles, cerium oxide particles, and a dispersion medium, and it is in a slurry state. A ratio of a content of the silicon oxide particles to a content of the cerium oxide particles in the polishing agent is within a range of 0.2 to 20 by mass.

According to the polishing agent of the present invention, it is possible to polish a surface to be polished of a polishing object whose hardness and chemical stability are high such as an SiC single-crystal substrate at a high polishing rate, and to stably obtain a flat and smooth surface.

The pH of the polishing agent of the present invention is preferably set to be 11 or less. A pH adjusting agent can be added to adjust the pH at 11 or less. When the pH of the polishing agent is set to be 11 or less, an oxidant acts effectively, and therefore, polishing properties become good, and dispersion stability of the cerium oxide particles being the abrasive particles is also excellent. Hereinafter, each component and the pH of the polishing agent of the present invention are described in detail.

(Oxidant)

The oxidant contained in the polishing agent of the present invention can form an oxide layer at a surface to be polished of a later-described polishing object (for example, an SiC single-crystal substrate or a GaN single-crystal substrate). Removing the oxide layer from the polished surface by a mechanical force promotes the polishing of the object to be polished. Specifically, a compound semiconductor of SiC, GaN, or the like is a non-oxide and is a material hard to be polished, but the oxide layer can be formed on its surface owing to the oxidant in the polishing agent. Since the formed oxide layer is lower in hardness and thus more easily polished compared with the object to be polished, it can be effectively removed by the cerium oxide particles being the abrasive particles. As a result, a high polishing rate can be obtained.

The oxidant is the one having redox potential of 0.5 V or more and containing a transition metal. Examples of the oxidant having a 0.5 V redox potential or more and containing the transition metal are permanganate ion, vanadate ion, dichromate ion, ceric ammonium nitrate, iron (III) nitrate nonahydrate, silver nitrate, phosphotungstic acid, tungstosilicic acid, phosphomolybdic acid, phosphotungstomolybdic acid, phosphovanadomolybdic acid, and so on, and especially preferable is permanganate ion. As a supply source of permanganate ion, permanganate such as potassium permanganate and sodium permanganate is preferable.

Reasons why permanganate ion is especially preferable as the oxidant in the polishing of the SiC single-crystal substrate are described below.

(1) Permanganate ion has a strong oxidizing power to oxidize the SiC single crystal.

When the oxidizing power of the oxidant is too weak, its reaction with the surface to be polished of the SiC single-crystal substrate is insufficient, resulting in inability to obtain a sufficiently smooth surface. As an index of the oxidizing power with which the oxidant oxidizes a substance, redox potential is used. Permanganate ion has 1.70 V redox potential and is higher in the redox potential compared with potassium perchlorate ($KClO_4$) (redox potential 1.20 V) and sodium hypochlorite (NaClO) (redox potential 1.63 V) which are generally used as an oxidant.

(2) The reaction rate of permanganate ion is high.

Being higher in the reaction rate of the oxidation reaction compared with hydrogen peroxide (redox potential 1.76 V) known as an oxidant having a strong oxidizing power, permanganate ion can quickly exhibit the strong oxidizing power.

(3) Environmental impact of permanganate ion is small.

(4) Permanganate is completely dissolved in a later-described dispersion medium (water). Therefore, there is no adverse effect of dissolution residues in smoothness of the substrate.

In order to obtain effect of a higher polishing rate, a content rate (concentration) of the permanganate ion in the polishing agent is preferably not less than 0.015 mass % nor more than 5 mass % to whole of the polishing agent. When it is less than 0.015 mass %, the effect as the oxidant cannot be expected, and it may take a very long time to form the smooth surface by the polishing, or scratches may be generated at the surface to be polished. When the content rate of the permanganate ion is more than 5 mass %, depending on the temperature of the polishing agent, the permanganate is not completely dissolved to precipitate, and the precipitated solid permanganate may cause scratches due to the contact with the surface to be polished. The content rate of the permanganate ion in the polishing agent is more preferably not less than 0.02 mass % nor more than 4 mass %, especially preferably not less than 0.05 mass % nor more than 3 mass %.

(Cerium Oxide Particles)

Cerium oxide (herein after, also referred to as ceria) particles contained in the polishing agent of the present invention are abrasive particles to remove an oxide layer formed by the oxidant on the surface to be polished. This oxide layer is removed by chemical and mechanical functions of the cerium oxide particles, and thereby, the polishing is accelerated. An average secondary particle diameter of the cerium oxide particles is preferably 0.5 μm or less. The particles whose average secondary particle diameter is 0.5 μm or less are used, and thereby, scratches and the like caused by mechanical damages on the surface to be polished can be reduced. The average secondary particle diameter of the cerium oxide particles is more preferably 0.2 µm or less.

When the cerium oxide particles are used together with the above-stated oxidant to polish the SiC single-crystal substrate, a polishing rate is higher owing to chemical and mechanical functions, and a smooth surface whose surface roughness is small can be obtained compared to a case when only silica particles are used as abrasive particles. A reason why the cerium oxide particles are particularly preferable is not known exactly, but by using the cerium oxide particles, a high polishing rate can be obtained in polishing via a chemical reaction relative to a glass and a silicon oxide film formed by a CVD (Chemical Vapor Deposition) deposition method. It is expected for the SiC single-crystal substrate that an oxide layer composed of silicon and oxygen is formed on the surface to be polished by the oxidant, and therefore, it is conceivable that a chemical reaction occurs between the formed oxide layer and the cerium oxide particles as same as the glass and the silicon oxide film formed by the CVD deposition method and the cerium oxide. There is an advantage in which polishing acceleration effect is expected by this chemical reaction.

When the cerium oxide particles exceeding the afore-mentioned range of the average secondary particle diameter are used as the abrasive particles, damages given to the surface to be polished of the SiC single-crystal substrate is large, and a smooth and high-quality surface is difficult to obtain. When the polishing is performed by using the polishing agent containing the cerium oxide particles whose average secondary particle diameter exceeds 0.5 µm, damages such as a bend and a distortion caused by an excessive mechanical function are found at a step line of a crystal atom of the SiC single-crystal substrate after the polishing. Accordingly, there is a possibility in which a crystal defect and the like may be generated at a film of a silicon carbide semiconductor and the like formed by an epitaxial growth at the surface after the polishing.

Note that the cerium oxide particles generally exist as agglomerated particles (secondary particles) in which primary particles are agglomerated in the polishing agent, and therefore, the preferable particle diameter of the cerium oxide particle is represented by the secondary particle diameter (average agglomerated particle diameter). The average secondary particle diameter can be measured, for example, by a particle size distribution analyzer using dynamic light scattering.

A content rate (concentration) of the cerium oxide particles in the polishing agent of the present invention is preferably 0.05 mass % or more and 15 mass % or less in order to obtain an enough polishing rate. When the content rate of the cerium oxide particles is less than 0.05 mass %, it is difficult to obtain the enough polishing rate, and when it exceeds 15.0 mass %, dispersibility of the cerium oxide particles deteriorates, and which may cause scratches on the surface to be polished. Besides, there is a problem in which a slurry cost increases. The content rate is more preferably 0.1 mass % to 10 mass %, further preferably 0.2 mass % to 5 mass %, and particularly preferably 0.2 mass % to 3 mass %.

(Silicon Oxide Particles)

The polishing agent of the present invention contains silicon oxide (herein after, also referred to as silica) particles together with the cerium oxide particles. The silicon oxide particles are contained, and thereby, it is possible to stably disperse the cerium oxide particles in the polishing agent in a slurry state. It is conceivable that the effect as stated above is owing to the following reasons. The cerium oxide particles is known that the dispersibility in a dispersion medium such as water is low, but when the silicon oxide particles whose dispersibility is comparatively good are contained at a predetermined ratio together with the cerium oxide particles, the silicon oxide particles whose surfaces are charged into minus are electrostatically absorbed to the cerium oxide particles whose surfaces are charged into plus. As a result, it becomes a state in which the surface of the cerium oxide particle is covered with the silicon oxide, and thereby, it is conceivable that the dispersibility of the cerium oxide particles is improved.

An average secondary particle diameter of the silicon oxide particles improving the dispersibility of the cerium oxide particles as stated above is preferably 0.5 µm or less, and more preferably 0.2 µm or less. Besides, the silicon oxide particle is preferably colloidal silica. More specifically, colloidal silica synthesized using a silicate raw material, or an alkoxysilane raw material, and the like can be used. Note that the silicon oxide particles such as colloidal silica exist as the secondary particles in which the primary particles are agglomerated in the polishing agent as same as the cerium oxide particles, and therefore, a preferable particle diameter of the silicon oxide particle is represented by the average secondary particle diameter. The average secondary particle diameter of the silicon oxide particles in the polishing agent can be measured, for example, by the particle size distribution analyzer using dynamic light scattering.

In the polishing agent of the present invention, a mass ratio of the content of the silicon oxide particles to the content of the cerium oxide particles (herein after, there is a case when it is referred to as silicon oxide/cerium oxide) is from 0.2 to 20. When the silicon oxide/cerium oxide is less than 0.2, the effect of the dispersibility improvement of the cerium oxide particles is insufficient. On the other hand, when the silicon oxide/cerium oxide exceeds 20, contacts between the cerium oxide particles and the surface to be polished are disturbed by the silicon oxide particles, and therefore, the polishing rate is lowered. The silicon oxide/cerium oxide is preferably within a range of 0.25 to 10, more preferably within a range of 0.5 to 5, and particularly preferably within a range of 0.5 to 3.

(pH and pH Adjusting Agent)

PH of the polishing agent of the present invention is preferably 11 or less, more preferably 5 or less, and particularly preferably 3 or less from view points of the polishing properties and dispersion stability of the cerium oxide particles. When the pH exceeds 11, the smoothness of the surface to be polished may deteriorate, due to the deterioration of the dispersibility of the cerium oxide particles.

PH of the polishing agent of the present invention can be adjusted by the addition/mixture of acid or a basic compound being a pH adjusting agent. As the acid, inorganic acid such as nitric acid, sulfuric acid, phosphoric acid, or hydrochloric acid; saturated carboxylic acid such as formic acid, acetic acid, propionic acid, or butyric acid; hydroxy acid such as lactic acid, malic acid, or citric acid; aromatic carboxylic acid such as phthalic acid or salicylic acid; dicarboxylic acid such as oxalic acid, malonic acid, succinic acid, glutaric acid, adipic acid, fumaric acid, or maleic acid; the other organic acids such as amino acid, heterocyclic carboxylic acid can be used. The use of nitric acid or phosphoric acid is preferable, and above all, the use of nitric acid is especially preferable. As the basic compound, usable are inorganic alkali such as ammonia, lithium hydroxide, potassium hydroxide, sodium hydroxide; a quaternary ammonium compound such as tetramethyl ammonium; and organic amine such as monoethanolamine, ethyl ethanolamine, diethanolamine, and propylene diamine. The use of potassium hydroxide or sodium hydroxide is preferable, and above all, the use of potassium hydroxide is especially preferable.

The content rate (concentration) of these acids or basic compounds is set to an amount so that pH of the polishing agent is adjusted to the predetermined range (pH11 or less, more preferably 5 or less, still more preferably 3 or less).

(Dispersion Medium)

In the polishing agent of the present invention, water is contained as a dispersion medium. The water is a medium for stably dispersing the cerium oxide particles and the silicon oxide particles and for dispersing and dissolving the oxidant and later-described optional components which are added when necessary. With respect to water, there is no particular limitation. Pure water, ultrapure water, or ion-exchanged water (deionized water) is preferred in view of an influence on other compounding components, the contamination of impurities, and an influence on pH or the like.

(Preparation of Polishing Agent and Arbitrary Components)

The polishing agent of the present invention is prepared and used such that the above-stated components are contained at the predetermined ratio, the cerium oxide particles and the silicon oxide particles are uniformly dispersed, and the other components are uniformly dissolved to be a mixed state. For the mixing, it is possible to adopt a method, for example, the stirring and mixing method by an ultrasonic dispersion machine, a homogenizer, or the like, generally used in the manufacture of the polishing agent. The polishing agent does not necessarily have to be supplied to a polishing site as one in which all the polishing components are mixed in advance. At the time of the supply to the polishing site, the polishing components may be mixed to form the composition of the polishing agent.

The polishing agent can contain an anti-agglomeration or dispersing agent (herein after, referred to as the dispersing agent) other than the silicon oxide particles, a lubricant, a chelating agent, a reducing agent, a viscosity imparting agent or a viscosity modifier, an anti-corrosion agent, and so on according to need as long as it is not against purposes of the present invention. Note that when these additives have a function of an oxidant, acid, or a basic compound, they are treated as the oxidant, acid or basic compound.

The dispersing agent is the one to be added to stably disperse the cerium oxide particles being the abrasive particles in the dispersion medium such as pure water. Besides, the lubricant properly adjusts a polishing stress generated in a polishing object, and enables stable polishing. An anionic, cationic, nonionic, amphoteric surfactant, and a water-soluble polymer having a surfactant function can be used as the dispersing agent. An anionic, cationic, nonionic, amphoteric surfactant, a polysaccharide, a water-soluble polymer, and the like can be used as the lubricant.

As the surfactant, usable is one which has an aliphatic hydrocarbon group and an aromatic hydrocarbon group as hydrophobic groups and in which one binding group or more such as ester, ether, or amide and one connecting group or more such as an acyl group and an alkoxyl group are introduced into these hydrophobic groups, and one having, as a hydrophilic group, carboxylic acid, sulfonic acid, sulfate ester, phosphoric acid, phosphoric acid ester, or amino acid can be used. As the polysaccharide, alginic acid, pectin, carboxymethylcellulose, curdlan, pullulan, xanthan gum, carrageenan, gellan gum, locust be an gum, gum arabic, tamarind, psyllium, or the like can be used. As the water-soluble polymer, polyacrylic acid, polyvinyl alcohol, polyvinyl pyrrolidone, polymethacrylic acid, polyacrylamide, polyaspartic acid, polyglutamic acid, polyethyleneimine, polyallylamine, polystyrene sulfonic acid, or the like can be used. When the dispersing agent and the lubricant are used, a content rate of each is preferably set to be within a range of 0.001% to 5% relative to total amount of the polishing agent by mass.

[Polishing Object]

A polishing object polished by using the polishing agent of the present invention is a non-oxide single-crystal substrate. Examples of the non-oxide single-crystal substrate are compound semiconductor substrates such as a SiC single-crystal substrate and a GaN single-crystal substrate. In particular, by polishing the surface to be polished of the single-crystal substrate whose modified Mohs hardness is 10 or more, such as the aforesaid SiC single-crystal substrate or GaN single-crystal substrate by using the polishing agent of the present invention, it is possible to obtain the effect of improving the polishing rate more.

[Polishing Method]

As a method for polishing the non-oxide single-crystal substrate being the polishing object by using the polishing agent of the present invention, a method in which the polishing agent is supplied to a polishing pad, the surface to be polished of the polishing object and the polishing pad are brought into contact, and the polishing is performed by a relative movement between both is preferable.

In the above-stated polishing method, a conventionally known polishing apparatus can be used. FIG. 1 shows an example of the polishing apparatus usable in the embodiment of the present invention, but the polishing apparatus used for the embodiment of the present invention is not limited to one having such a structure.

The polishing apparatus 10 shown in FIG. 1 is provided with a polishing platen 1 which is supported to be rotatable around its vertical axis C1, and the polishing platen 1 is driven to rotate in the direction indicated by the arrow in the drawing by a platen driving motor 2. On an upper surface of this polishing platen 1, a well-known polishing pad 3 is affixed.

On the polishing platen 1, at a position eccentric from the axis C1, a substrate holding member (carrier) 5 for holding a object 4 to be polished such as a SiC single-crystal substrate on its lower surface by using suction, a holding frame, or the like is supported to be rotatable around its axis C2 and to be movable in a direction along the axis C2. The substrate holding member 5 is rotated in the direction indicated by the arrow by a not-shown carrier driving motor or by a rotational moment received from the aforesaid polishing platen 1. On the lower surface of the substrate holding member 5, that is, on its surface facing the aforesaid polishing pad 3, the object 4 to be polished is held. The object 4 to be polished is pressed against the polishing pad 3 by a predetermined load.

Near the substrate holding member 5, a dripping nozzle 6 or the like is provided, so that the polishing agent 7 of the present invention fed from a not-shown tank is supplied onto the polishing pad 3.

At the time of the polishing by such a polishing apparatus 10, the polishing platen 1 and the polishing pad 3 affixed thereon, and the substrate holding member 5 and the object 4 to be polished supported on the its lower surface are driven to rotate around their axes by the platen driving motor 2 and the work driving motor, respectively. Then, in this state, the polishing agent 7 is supplied from the dripping nozzle 6 or the like to the surface of the polishing pad 3, and the object 4 to be polished held by the substrate holding member 5 is pressed against the polishing pad 3. Consequently, the surface to be polished of the object 4, that is, its surface facing the polishing pad 3, is chemically and mechanically polished.

The substrate holding member 5 may perform not only the rotational movement but also a linear movement. Further, the polishing platen 1 and the polishing pad 3 may not be per-forming the rotational movement, and for example, may move in one direction by a belt system.

As the polishing pad 3, the one made up of a nonwoven fabric, a porous resin such as polyurethane foam, a nonporous resin, and the like can be used. The polishing pad 3 is preferable the one which does not contain the abrasive particles. Further, to accelerate the supply of the polishing agent 7 to the polishing pad 3 or to allow a certain amount of the polishing agent 7 to stay in the polishing pad 3, the surface of the polishing pad 3 may be worked to have a groove in a lattice shape, a concentric shape, a spiral shape, or the like. Further, when necessary, a pad conditioner may be brought into contact with the surface of the polishing pad 3 to polish while conditioning the surface of the polishing pad 3.

A condition of the polishing by such a polishing apparatus 10 is not particularly limited, but it is possible to increase a polishing pressure and improve the polishing rate by applying a load to the substrate holding member 5 to press it against the polishing pad 3. The polishing pressure is preferably about 5 to 80 kPa, and in view of uniformity of the polishing rate in the surface to be polished, flatness of the surface to be polished, and the prevention of a polishing defect such as a scratch, the polishing pressure is more preferably about 10 to 50 kPa. The rotation speed of the polishing platen 1 and the substrate holding member 5 is preferably about 50 to 500 rpm but is not limited thereto. Further, a supply amount of the polishing agent 7 is appropriately adjusted and selected according to a constitution material of the surface to be polished, the composition of the polishing agent, the aforesaid polishing condition, and so on.

EXAMPLES

Hereinafter, the present invention is described more concretely by examples and comparative examples, but the present invention is not limited to these examples. Examples 1 to 18 are the working examples of the present invention, and examples 19 to 24 are comparative examples.

Examples 1 to 24

(1) Preparation of Polishing Agent (1-1)

Respective polishing agents of the examples 1 to 18 were prepared in the following manner. First, pure water was added to potassium permanganate being the oxidant shown in Table 1, it was stirred by using a stirring blade for 10 minutes. Next, colloidal silica was added to this liquid, it is stirred by using the stirring blade for 10 minutes, and thereafter, any one kind from phosphoric acid, nitric acid, potassium hydroxide shown in Table 1 is added little by little while stirring as the pH adjusting agent, to prepare a liquid additives A. Next, the cerium oxide particles whose average secondary particle diameter was 0.18 μm being the abrasive particles were added to pure water to be twice of a concentration of abrasive particles shown in Table 1, it was stirred by using the stirring blade for 10 minutes, to prepare an abrasive particle-liquid B.

Next, the liquid additives A and the abrasive particle-liquid B were mixed at a mass ratio of 1:1, it was stirred by using the stirring blade for 10 minutes to obtain the polishing agents of the examples 1 to 18. An addition amount of the pH adjusting agent in the liquid additives A was adjusted to be a predetermined pH shown in Table 1 in the respective polishing agents after the liquid additives A and the abrasive particle-liquid B were mixed. Content rates (concentration: mass %) of respective components relative to the whole of the polishing agents used in the examples 1 to 18 are shown in Table 1. Note that each concentration of the oxidant in Table 1 is not the concentration of permanganate ion, but a concentration of potassium permanganate. It is also the same in the later-described examples 22 to 24.

(1-2)

Respective polishing agents of the examples 19 to 24 were prepared as described in the following. In the example 19, at first, pure water was added to a colloidal silica dispersion liquid whose silica solid content was approximately 40 mass %, of which primary particle diameter was 0.04 μm, average secondary particle diameter was 0.07 μm, and it was stirred by using the stirring blade for 10 minutes. Next, ammonium vanadate was added to this liquid as a metal salt while stirring, hydrogen peroxide solution was finally added and stirred for 30 minutes, to obtain the polishing agent adjusted to be predetermined respective component concentrations shown in Table 1. In the examples 20, 21, the cerium oxide particles whose average secondary particle diameter was 0.18 μm was added to pure water, it was stirred by using the stirring blade for 10 minutes, and thereafter, the phosphoric acid was added little by little as the pH adjusting agent to adjust to be a predetermined pH shown in Table 1, and the polishing agents were obtained. In the example 22, the polishing agent was prepared as same as the example 1 except that colloidal silica was not added. In the example 23, the polishing agent was prepared as same as the example 1 except that an addition amount of colloidal silica was changed. In the example 24, the polishing agent was obtained as same as the example 1 except that the addition amounts of the cerium oxide particles and colloidal silica were changed. Content rates (concentration: mass %) of respective components used in the examples 19 to 24 relative to the whole of the polishing agent are shown in Table 1.

The primary particle size of the colloidal silica particles compounded in the examples 19 was found by conversion from a specific surface area obtained by a BET method, and the average secondary particle size was measured by "Microtrac UPA" (manufactured by NIKKISO Co., Ltd.). Besides, the average secondary particle diameters of colloidal silica contained in each of the polishing agents of the examples 1 to 18, the example 23 and the example 24 were measured by "Microtrac UPA" (manufactured by Nikkiso Co., Ltd.). Further, the average secondary particle diameters of the cerium oxide particles contained in each of the polishing agents of the examples 1 to 18 and the examples 20 to 24 were measured by "LA920" (manufactured by Horiba Ltd.).

(1-3) Measurement of pH

PH of the polishing agents obtained in the examples 1 to 24 were measured by using "pH81-11" manufactured by Yokogawa Electric Corporation at 25° C. Measurement results are shown in 1.

TABLE 1

| | Cerium oxide abrasive particle | Cerium oxide abrasive particle concentration (wt %) | Kind of silica particle | Silica particle concentration (wt %) | Average secondary particle diameter of silica particle (μm) | Particle mass ratio (silica particle concentration/ Ceria particle concentration) | Kind of oxidant | Concentration of oxidant (wt %) | Kind of metal salt Metal salt concentration (wt %) | pH adjusting agent | pH |
|---|---|---|---|---|---|---|---|---|---|---|---|
| E1 | Cerium oxide | 1 | Colloidal silica | 1 | 0.07 | 1 | Potassium permanganate | 1.58 | — | Phosphoric acid | 2 |
| E2 | Cerium oxide | 1 | Colloidal silica | 0.5 | 0.07 | 0.5 | Potassium permanganate | 1.58 | — | Phosphoric acid | 2 |
| E3 | Cerium oxide | 1 | Colloidal silica | 0.25 | 0.07 | 0.25 | Potassium permanganate | 1.58 | — | Phosphoric acid | 2 |
| E4 | Cerium oxide | 0.1 | Colloidal silica | 0.1 | 0.05 | 1 | Potassium permanganate | 1.58 | — | Phosphoric acid | 2 |
| E5 | Cerium oxide | 1 | Colloidal silica | 0.5 | 0.07 | 0.5 | Potassium permanganate | 0.35 | — | Phosphoric acid | 2 |
| E6 | Cerium oxide | 1 | Colloidal silica | 0.5 | 0.07 | 0.5 | Potassium permanganate | 0.25 | — | Phosphoric acid | 2 |
| E7 | Cerium oxide | 1 | Colloidal silica | 0.5 | 0.07 | 0.5 | Potassium permanganate | 3.16 | — | Phosphoric acid | 2 |
| E8 | Cerium oxide | 1 | Colloidal silica | 0.5 | 0.07 | 0.5 | Potassium permanganate | 0.025 | — | Nitric acid | 2 |
| R9 | Cerium oxide | 1 | Colloidal silica | 0.5 | 0.07 | 0.5 | Potassium permanganate | 1.58 | — | Nitric acid | 2 |
| E10 | Cerium oxide | 1 | Colloidal silica | 0.5 | 0.07 | 0.5 | Potassium permanganate | 3.16 | — | Nitric acid | 2 |
| E11 | Cerium oxide | 1 | Colloidal silica | 0.5 | 0.07 | 0.5 | Potassium permanganate | 3.16 | — | Nitric acid | 5 |
| E12 | Cerium oxide | 1 | Colloidal silica | 0.5 | 0.07 | 0.5 | Potassium permanganate | 3.16 | — | KOH | 8 |
| E13 | Cerium oxide | 1 | Colloidal silica | 0.5 | 0.07 | 0.5 | Potassium permanganate | 3.16 | — | KOH | 11 |
| E14 | Cerium oxide | 2 | Colloidal silica | 1 | 0.07 | 0.5 | Potassium permanganate | 5 | — | Nitric acid | 2 |
| E15 | Cerium oxide | 0.1 | Colloidal silica | 1 | 0.07 | 10 | Potassium permanganate | 5 | — | Nitric acid | 2 |
| E16 | Cerium oxide | 0.1 | Colloidal silica | 2 | 0.07 | 20 | Potassium permanganate | 5 | — | Nitric acid | 2 |
| E17 | Cerium oxide | 1 | Colloidal silica | 20 | 0.07 | 20 | Potassium permanganate | 1.58 | — | Nitric acid | 2 |
| E18 | Cerium oxide | 1 | Colloidal silica | 20 | 0.07 | 20 | Potassium permanganate | 1.58 | — | Phosphoric acid | 2 |
| E19 | None | None | Colloidal silica | 20 | 0.07 | — | Hydrogen peroxide | 1 | Ammonium vanadate 0.5 | — | 6.5 |
| E20 | Cerium oxide | 1 | — | — | — | — | — | — | — | Phosphoric acid | 2 |
| E21 | Cerium oxide | 0.1 | — | — | — | — | — | — | — | Phosphoric acid | 2 |
| E22 | Cerium oxide | 1 | — | — | — | — | Potassium permanganate | 1.58 | — | Phosphoric acid | 2 |
| E23 | Cerium oxide | 1 | Colloidal silica | 0.1 | 0.07 | 0.1 | Potassium permanganate | 1.58 | — | Phosphoric acid | 2 |
| E24 | Cerium oxide | 0.7 | Colloidal silica | 20 | 0.1 | 29 | Potassium permanganate | 1.58 | — | Phosphoric acid | 2 |

E1 to E24 = Example 1 to Example 24

(2) Evaluation of Polishing Properties of Polishing Agent

Evaluation of the polishing properties is performed by the following method as for the respective polishing agents obtained in the examples 1 to 24.

(2-1) Polishing Conditions

As a polishing machine, a small-size polishing apparatus manufactured by MAT Inc. was used. As a polishing pad, "SUBA800-XY-groove" (manufactured by Nitta Haas Incorporated) was used, and the conditioning of the polishing pad was performed by using a diamond disk before the polishing. A feeding rate of the polishing agents was set to 25 ml/minute, the rotation speed of the polishing platen was set to 68 rpm, the rotation speed of the substrate holding member was set to 68 rpm, the polishing pressure was set to 5 psi (34.5 kPa), and the polishing was performed for thirty minutes.

(2-2) Object to be Polished

As an object to be polished, a 4H-SiC substrate with a 3 inch diameter having undergone a preliminary polishing process using diamond abrasive particles was used. A SiC single-crystal substrate whose main surface (0001) was within 0°±0.25° with respect to a C axis (an On-axis substrate) and a SiC single-crystal substrate whose an off-angle of the main surface with respect to a C axis was within 4°±0.5° were used, and their Si surface sides were polished, and the evaluation was conducted. Note that only the polishing property (polishing rate) for the SiC single-crystal substrate whose off-angle was within 4° (herein after, referred to as a 4° off substrate) was evaluated as for each of the polishing agents of the example 8, the examples 14 to 18, and the examples 20 to 24. Besides, only the polishing property (polishing rate) for the On-axis substrate was evaluated as for each of the polishing agents of the example 5 and the example 6.

(2-3) Measurement of Polishing Rate

The polishing rate was evaluated based on an amount (nm/hr) of change in thickness of each of the SiC single-crystal substrates per unit time. Specifically, a mass of each of the unpolished substrates with a known thickness and a mass of each of the substrates after polished for each period of time were measured, and the mass change was determined from the difference between them. Further, the change in thickness of the substrates determined from the mass change per period of time was calculated using the following formulas. The calculation results of the polishing rate are shown in Table 2.
(Formulas for Calculating Polishing Rate (V))

$$\Delta m = m0 - m1$$

$$V = \Delta m/m0 \times T0 \times 60/t$$

(in the formulas, $\Delta m(g)$ represents the mass change between before and after the polishing, $m0(g)$ represents the initial mass of the unpolished substrate, $m1(g)$ represents the mass of the substrate after polished, V represents the polishing rate (nm/hr), T0 represents the thickness (nm) of the unpolished substrate, and t represents the polishing time (min)).

(3) Evaluation of Slurry Dispersibility

Dispersibility of the cerium oxide particles in the slurry as for each of the polishing agents obtained in the examples 1 to 24 was evaluated. The evaluation was performed as follows: each polishing agent was put into a test tube of 20 cc and stirred, then it was left still, and a time until a supernatant layer was recognized was measured. When the time until the supernatant layer was recognized was 15 minutes or more, the slurry dispersibility was evaluated as "good", when the time was one minute or more and less than 15 minutes, it was evaluated as "rather bad", when the supernatant layer was recognized just after it was left still (less than one minute), it was evaluated as "bad". Evaluation results of the slurry dispersibility are also shown in Table 2.

TABLE 2

| | Polishing Rate for 4° off substrate (nm/hr) | Polishing Rate for On-axis substrate (nm/hr) | Slurry Dispersibility |
|---|---|---|---|
| E1 | 625 | 372 | Good |
| E2 | 583 | 344 | Good |
| E3 | 537 | 399 | Rather bad |
| E4 | 481 | 385 | Good |
| E5 | — | 179 | Good |
| E6 | — | 110 | Good |
| E7 | 819 | 579 | Good |
| E8 | 125 | — | Good |
| R9 | 1059 | 661 | Good |
| E10 | 1281 | 827 | Good |
| E11 | 812 | 551 | Good |
| E12 | 817 | 467 | Good |
| E13 | 275 | 179 | Good |
| E14 | 1510 | — | Good |
| E15 | 1440 | — | Good |
| E16 | 1426 | — | Good |
| E17 | 825 | — | Good |
| E18 | 322 | — | Good |
| E19 | 83 | 69 | Good |
| E20 | 10 | — | Bad |
| E21 | 5 | — | Bad |
| E22 | 560 | — | Bad |
| E23 | 540 | — | Bad |
| E24 | 84 | — | Good |

E1 to E24 = Example 1 to Example 24

As will be seen from Table 2, when the polishing agents of the examples 1 to 18 being the working examples are used, a high polishing rate is obtained for at least one of the On-axis substrate and the 4° off substrate, and especially when the polishing agents of the examples 1 to 4, the example 7, and the examples 9 to 13 are used, a high polishing rate is obtained for both of the On-axis substrate and the 4° off substrate, and therefore, high-speed polishing is possible. Besides, the slurry dispersibilities of the polishing agents of the examples 1 to 18 are enough good.

On the other hand, when the polishing agent of the example 19 containing colloidal silica, hydrogen peroxide, and ammonium vanadate is used, the polishing rate is lower as compared with the cases when the polishing agents of the examples 1 to 18 are used. Besides, when the polishing agents of the examples 20 to 22 containing the cerium oxide particles and not containing colloidal silica are used, the slurry dispersibility is bad, and the sediment and separation of the cerium oxide particles are recognized just after it is left still. When the polishing agents of the examples 20 to 21 not containing potassium permanganate being the oxidant are used, the polishing rate is drastically lowered.

Besides, when the polishing agent of the example 23 containing the cerium oxide particles, colloidal silica, and potassium permanganate, but the mass ratio of colloidal silica relative to the cerium oxide particles is 0.1 to be less than a predetermined lower limit (0.2) is used, the high polishing rate can be obtained, but the slurry dispersibility becomes worse. Further, when the polishing agent of the example 24 containing the cerium oxide particles, colloidal silica, and potassium permanganate, but the mass ratio of colloidal silica relative to the cerium oxide particles is 29 exceeding a predetermined upper limit (20) is used, the polishing rate is drastically lowered compared to the cases when the polishing agents of the examples 1 to 18 are used.

According to the present invention, it is possible to polish a non-oxide single-crystal substrate, in particular, a compound semiconductor substrate high in hardness and high in chemical stability, such as a SiC single-crystal substrate and a GaN single-crystal substrate, at a high polishing rate, and to obtain a polished surface free from scratches and excellent in flatness and smoothness owing to excellent dispersibility of cerium oxide particles being abrasive particles. Therefore, it is possible to contribute to an improvement in productivity of the non-oxide single-crystal substrate substrates.

The present invention has been described in detail while referring to specific embodiments, but, it is obvious for a person skilled in the art that the invention can be variously modified and changed without departing from the scope and the spirit of the present invention.

What is claimed is:

1. A polishing agent for chemically and mechanically polishing a non-oxide single-crystal substrate, the polishing agent comprising:
   an oxidant having redox potential of 0.5 V or more and containing a transition metal;
   silicon oxide particles and cerium oxide particles; and
   a dispersion medium,
   wherein the oxidant is permanganate ion, and a mass ratio of the silicon oxide particles to the cerium oxide particles is from 0.2 to 20.

2. The polishing agent according to claim 1, wherein a content of permanganate ion is 0.015 mass % or more and 5 mass % or less.

3. The polishing agent according to claim 1, wherein a content of the cerium oxide particles is 0.05 mass % or more and 15 mass % or less.

4. The polishing agent according to claim 1, wherein an average secondary particle diameter of the cerium oxide particles is 0.5 μm or less.

5. The polishing agent according to claim 1, wherein an average secondary particle diameter of the silicon oxide particles is 0.5 μm or less.

6. The polishing agent according to claim 1, wherein the silicon oxide particle is colloidal silica.

7. The polishing agent according to claim 1, wherein pH is 11 or less.

8. The polishing agent according to claim 7, wherein pH is 5 or less.

9. The polishing agent according to claim 1, wherein the non-oxide single-crystal substrate is a silicon carbide (SiC) single-crystal substrate or a gallium nitride (GaN) single-crystal substrate.

10. A polishing method comprising:
supplying the polishing agent according to claim 1 to a polishing pad;
bringing a surface to be polished of a non-oxide single-crystal substrate being a polishing object into contact with the polishing pad; and
polishing by a relative movement between the surface to be polished and the polishing pad.

11. The polishing agent according to claim 1, wherein the oxidant is permanganate ion and is present in an amount of from 0.015 mass % to 5 mass %,
the cerium oxide particles have an average secondary particle diameter of 0.5 μm or less and are present in an amount of 0.05 mass % to 15 mass %., and
the silicon oxide is colloidal silica and the silicon oxide particles have an average secondary particle diameter of 0.5 μm or less.

12. The polishing agent according to claim 11, wherein the permanganate ion is present in an amount of from 0.02 mass % nor to 4 mass %.

13. The polishing agent according to claim 11, wherein the permanganate ion is present in an amount of from 0.05 mass % to 3 mass %.

14. The polishing agent according to claim 11, wherein the cerium oxide particles are present in an amount of from 0.2 mass % to 3 mass %.

15. The polishing agent according to claim 11, having a pH of 3 or less.

16. The polishing agent according to claim 1, having a pH of 5 or less.

* * * * *